United States Patent
Fujita et al.

(10) Patent No.: US 9,040,431 B2
(45) Date of Patent: May 26, 2015

(54) METHOD FOR PROCESSING SILICON WAFER

(71) Applicant: CANON KABUSHIKI KAISHA, Tokyo (JP)

(72) Inventors: Hirohisa Fujita, Saitama (JP); Shuji Koyama, Kawasaki (JP); Keiji Matsumoto, Kawasaki (JP); Kenta Furusawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/925,364

(22) Filed: Jun. 24, 2013

(65) Prior Publication Data

US 2014/0004629 A1  Jan. 2, 2014

(30) Foreign Application Priority Data

Jun. 27, 2012 (JP) ................................. 2012-144318

(51) Int. Cl.
*H01L 21/461* (2006.01)
*H01L 21/306* (2006.01)
*H01L 21/67* (2006.01)

(52) U.S. Cl.
CPC ..... *H01L 21/30604* (2013.01); *H01L 21/30608* (2013.01); *H01L 21/6708* (2013.01)

(58) Field of Classification Search
CPC ................... H01L 21/30604; H01L 21/30608; H01L 21/6708
USPC ................... 257/E21.223, E21.219, E21.252, 257/E21.256, 618, 774; 216/2, 27, 79, 90, 216/91, 99; 438/618, 747, 748
See application file for complete search history.

(56) References Cited

U.S. PATENT DOCUMENTS

| | | | | |
|---|---|---|---|---|
| 4,169,008 A | * | 9/1979 | Kurth | 216/27 |
| 4,448,635 A | * | 5/1984 | Kuiken et al. | 216/90 |
| 5,474,644 A | * | 12/1995 | Kato et al. | 156/345.11 |
| 7,160,808 B2 | * | 1/2007 | Kassir | 438/690 |
| 7,648,610 B2 | * | 1/2010 | Komiya et al. | 156/345.29 |
| 8,043,468 B2 | * | 10/2011 | Osawa et al. | 156/345.18 |
| 2002/0063169 A1 | * | 5/2002 | Verhaverbeke et al. | 239/436 |
| 2005/0045993 A1 | * | 3/2005 | Okuda et al. | 257/618 |
| 2008/0179666 A1 | * | 7/2008 | Foerster et al. | 257/330 |
| 2009/0115068 A1 | * | 5/2009 | Jang | 257/774 |
| 2010/0156990 A1 | * | 6/2010 | Morisue et al. | 347/44 |

FOREIGN PATENT DOCUMENTS

JP    6-349800 A    12/1994

* cited by examiner

*Primary Examiner* — Marvin Payen
*Assistant Examiner* — Victor Barzykin
(74) *Attorney, Agent, or Firm* — Canon U.S.A., Inc. IP Division (57) ABSTRACT

A method for processing a silicon wafer is provided. The method includes allowing an etchant to flow along a surface of the silicon wafer to form a line in which a plurality of apertures are arranged in a flow direction of the etchant from an upstream side to a downstream side. The apertures arranged in the line include a first aperture formed on the most upstream side and a second aperture formed downstream of the first aperture in the flow direction of the etchant. The first aperture and the second aperture are subjected to different processes after being formed.

18 Claims, 8 Drawing Sheets

FIG. 1

ETCHANT

METHOD FOR PROCESSING SILICON WAFER

BACKGROUND OF THE INVENTION

1. Field of the Invention

The present invention relates to a method for processing a silicon wafer.

2. Description of the Related Art

Silicon wafers used in the fields of semiconductor devices and ink jet apparatuses are etched by a variety of techniques. An example of such etching techniques is etching with an etchant (e.g., anisotropic etching). A known example of the etching with an etchant involves use of a batch-type apparatus in which multiple silicon wafers are placed in a bath containing an etchant.

In recent years, large-diameter silicon wafers have been developed. In addition, there has been a demand for more precise etching of silicon wafers. Hence, etching with single wafer apparatuses in which silicon wafers are etched one by one has been drawing attention, rather than etching with batch-type apparatuses in which multiple silicon wafers are etched at the same time. Japanese Patent Laid-Open No. 6-349800 discloses etching with a single wafer apparatus, in which an etchant continuously flows on a surface of a silicon wafer in the form of a laminar flow parallel to the surface of the silicon wafer.

In the single wafer apparatus disclosed in Japanese Patent Laid-Open No. 6-349800, the flow of an etchant can be balanced between the right and left regions on the surface of a silicon wafer relative to a flow direction of the etchant. Thus, apertures formed in the right and left regions on the surface of a silicon wafer can have a uniform shape.

SUMMARY OF THE INVENTION

In the case where a line in which multiple apertures are arranged in a flow direction of an etchant from the upstream side to the downstream side has been formed, the inventors have found that the following problem occurs on the upstream and downstream sides in the flow direction of the etchant, namely in the longitudinal direction. In particular, among the multiple apertures arranged in a line, the shape of the aperture formed on the most upstream side (first aperture) in the flow direction of the etchant is different from that of an aperture formed downstream of the first aperture in the flow direction of the etchant (second aperture) in some cases.

The inventors have further conducted studies and found that such a problem occurs due to air bubbles generated by the flow of an etchant. In particular, an etchant flows on smooth part of the surface of a silicon wafer and then swiftly enters the first aperture formed on the most upstream side; thus, generated air bubbles readily exit from the first aperture. In contrast, in a second aperture formed downstream of the first aperture, since the flow of the etchant is affected by the aperture positioned immediately upstream of the second aperture, a rate at which the etchant flows into the second aperture is decreased. Thus, air bubbles do not smoothly exit from the second aperture. Such a difference in the exit of air bubbles causes etching to progress faster in the first aperture than in the second aperture, which leads to formation of the first aperture and second aperture having different shapes. The difference in exit of air bubbles can be reduced by increasing a distance between apertures; however, since there has been a demand for forming many apertures in silicon wafers, putting a large distance between apertures is not practical.

For example, if such apertures having a difference in shape corresponding to a difference in the position thereof are used as liquid supply ports formed in the silicon substrates of liquid ejection heads, a supply port formed with the first aperture has a large width and depth, and a supply port formed with the second aperture has a small width and depth. Such a difference in the shape of a supply port between liquid ejection heads may give different ejection characteristics to liquid ejection heads to be produced. In the case where the first aperture and the second aperture are used in discrete products other than liquid ejection heads described as an example, it is also difficult to produce products having a uniform shape due to the difference in shape between these apertures.

The present invention provides a method for processing a silicon wafer, the method including allowing an etchant to flow along a surface of the silicon wafer to form a line in which a plurality of apertures are arranged in a flow direction of the etchant from an upstream side to a downstream side, wherein the apertures arranged in the line includes a first aperture formed on the most upstream side and a second aperture formed downstream of the first aperture in the flow direction of the etchant, and wherein the first aperture and the second aperture are subjected to different processes after being formed.

Further features of the present invention will become apparent from the following description of exemplary embodiments with reference to the attached drawings.

DESCRIPTION OF THE EMBODIMENTS

A method for processing a silicon wafer according to an embodiment of the present invention will now be described.

Figure 1:
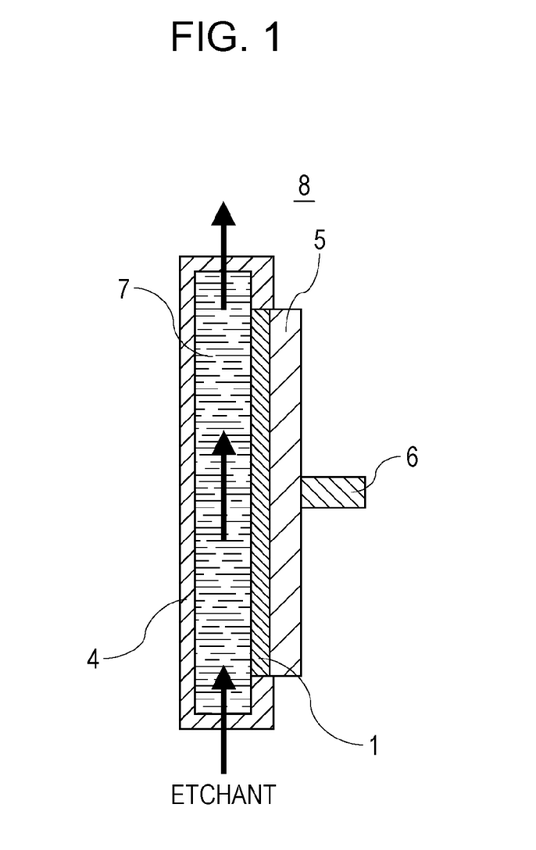
FIG. 1 illustrates a single wafer etching apparatus.

FIG. 1 illustrates a single wafer etching apparatus 8. The etching apparatus 8 includes an air cylinder 6, a support member 5, and a chamber 4. A silicon wafer 1 is disposed between the chamber 4 and the support member 5, and an etchant 7 is allowed to flow along the surface of the silicon wafer 1 to etch the silicon wafer 1. The etchant 7 can flow substantially in one direction relative to the surface of the silicon wafer 1 by adjusting the flow rate of the etchant 7 and the position and size of an inlet port. Although the etchant 7 contacts only one surface (top surface) of the silicon wafer 1 in FIG. 1, both the surfaces of the silicon wafer 1 may contact the etchant 7. The silicon wafer 1 is fixed between the chamber 4 and the support member 5 with, for instance, an O-ring, a rubber bulb, or a sealing member to prevent the etchant 7 from leaking to the outside. The etching apparatus 8 may be an open type or a closed type; a closed-type structure may be employed in terms of, for example, a heat-retaining property. The silicon wafer 1 may be disposed so as to be substantially vertical or parallel to a floor or so as to be inclined. In view of smooth exit of air bubbles generated by the flow of an etchant, the silicon wafer 1 may be disposed so as to be substantially vertical to a floor or so as to be inclined.

Any liquid which enables etching of the silicon wafer 1 can be used as the etchant 7. In particular, the etchant 7 may be a strong alkaline solution, and examples thereof include aqueous solutions of tetramethylammonium hydroxide (TMAH), potassium hydroxide (KOH), and sodium hydroxide (NaOH). These solutions may be used alone or in combination of two or more. Additives may be used to increase an etching rate. The temperature of an etchant is related to the etching rate of a silicon wafer. In order to enhance the etching rate of the silicon wafer 1, the temperature of the etchant 7 is preferably not less than 40° C., and more preferably not less than 70° C. The temperature is preferably not more than 98° C., and more preferably not more than 95° C.

Figure 2:
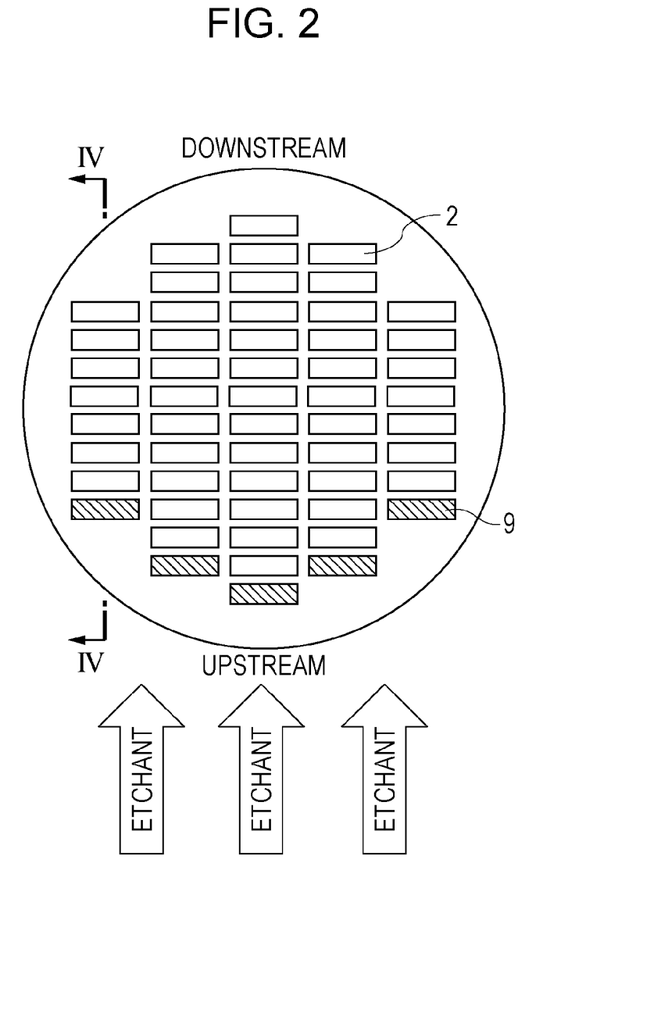
FIG. 2 illustrates etching of a silicon wafer.
Figure 4:
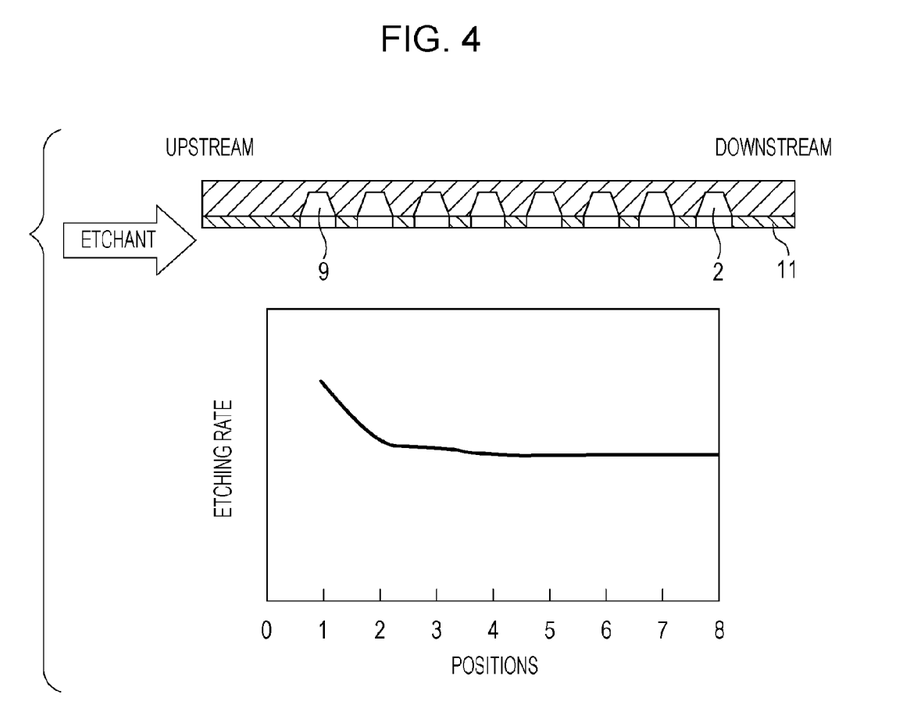
FIG. 4 is a cross-sectional view illustrating an etched silicon wafer.

FIG. 2 illustrates the silicon wafer 1 viewed from above. FIG. 2 illustrates a state in which apertures have been formed in the silicon wafer 1 by etching with an etchant. Multiple apertures are arranged in a line in a flow direction of the etchant from the upstream side to the downstream side. Multiple lines in which the apertures are arranged may be formed; five lines in which the apertures are arranged have been formed in FIG. 2. In FIG. 2, among multiple apertures arranged in lines, each aperture 9 is a first aperture formed on the most upstream side in the flow direction of the etchant. Etching rate is higher in each aperture 9, which is the first aperture, than in a second aperture (e.g., aperture 2) formed downstream of the first aperture in the flow direction of the etchant. FIG. 4 illustrates this state. FIG. 4 is a cross-sectional view illustrating the silicon wafer taken along the line IV-IV in FIG. 2. FIG. 4 includes illustration of etching rates in individual apertures corresponding to the apertures in the cross-sectional view. A protective layer 11 is formed on a surface of the silicon wafer, and etching progresses through openings formed in the protective layer 11. As is clear from the illustration of etching rates in FIG. 4, an etching rate is higher in the aperture 9, which is the first aperture, than in a second aperture (e.g., aperture 2) formed downstream of the first aperture in a flow direction of the etchant. It is believed that such a difference in an etching rate occurs because air bubbles generated by the flow of the etchant promptly exit from the first aperture but does not readily exit from the second aperture. The etching rate does not so vary in all of the apertures positioned downstream of the first aperture. In particular, the etching quickly progresses only in the first aperture but relatively slowly progresses in the second aperture positioned downstream thereof, which causes a difference in shape between the first aperture and the second aperture. Hence, in the case where the apertures are separated from each other after formation thereof and then used to produce products, the products have a variation in the shape of an aperture. The term "aperture" herein refers to a portion having a depth in the thickness direction of a silicon wafer from the opening formed in the surface of the silicon wafer.

Thus, in the present invention, the first aperture and the second aperture are subjected to different processes after formation thereof. It is determined, for example, weather the first aperture is suitable for use as a liquid supply port formed in the silicon substrate of a liquid ejection head or not. In particular, for instance, the shape of a liquid supply port is observed with a microscope, or the shape and size of a liquid supply port is measured through image processing; then, it is determined whether the result of such observation or measurement exceeds threshold value or not. Then, a first aperture determined as being suitable for use as a liquid supply port formed in the silicon substrate of a liquid ejection head is appropriately employed. A first aperture determined as being unsuitable for use as a liquid supply port formed in the silicon substrate of a liquid ejection head is not employed; for instance, it will be discarded. In contrast, the second aperture is not subjected to such determination and used as a liquid supply port formed in the silicon substrate of a liquid ejection head. Even when both the first and second apertures are used to produce products, such a process enables these products to have apertures having a more uniform shape.

Figure 3:
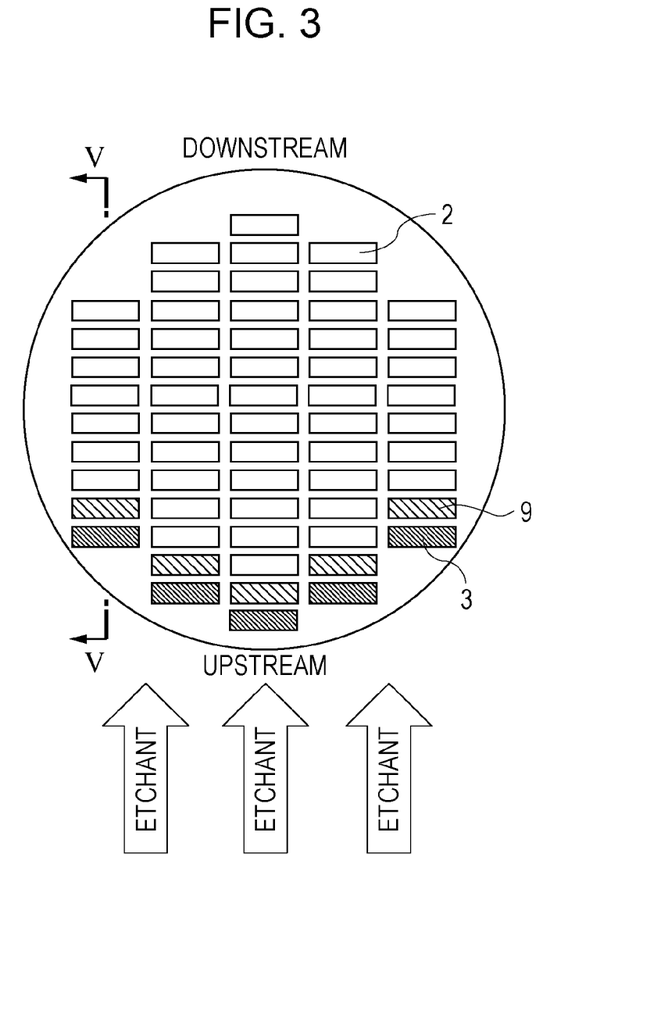
FIG. 3 illustrates etching of a silicon wafer.

Furthermore, in an application of the present invention, in view of the phenomenon in which etching particularly quickly progresses only in the first aperture, a dummy aperture may be formed upstream of an aperture formed for an intended use. This approach will be described with reference to FIGS. 3 and 5. FIG. 3 illustrates a silicon wafer viewed as in FIG. 2. In FIG. 3, apertures 3 are positioned further upstream of the apertures 9 illustrated in FIG. 2. The apertures 3 are different from apertures formed for an intended use; in other words, they are dummy apertures. In FIG. 3, among multiple apertures arranged in lines, the apertures formed on the most upstream side in a flow direction of an etchant are the apertures 3, and the apertures 3 therefore serve as the first apertures. Referring to the silicon substrate of a liquid ejection head as an example, each first aperture is formed as a dummy aperture which is not used as a liquid supply port. On the other hand, each aperture positioned downstream thereof in the flow direction of an etchant (e.g., second aperture) is formed to be used as a liquid supply port.

Figure 5:
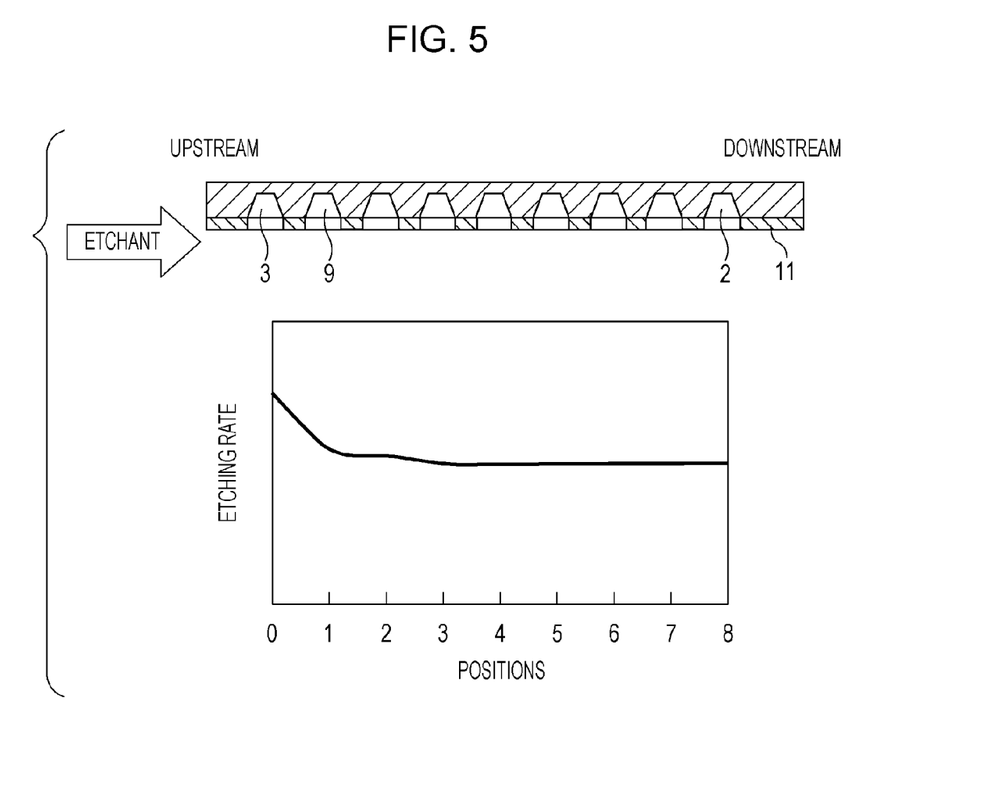
FIG. 5 is a cross-sectional view illustrating an etched silicon wafer.

FIG. 5 is a cross-sectional view illustrating the silicon wafer taken along the line V-V in FIG. 3. FIG. 5 includes illustration of etching rates in individual apertures corresponding to the apertures in the cross-sectional view as in FIG. 4. In the case where the dummy aperture 3 is formed, the dummy aperture 3 serves as the first aperture as described above. In FIG. 5, the position of the dummy aperture 3 is defined as the 0th position in a flow direction of an etchant; in particular, the dummy aperture 3 is an aperture formed at the 0th position. The etching rate is higher in the dummy aperture 3 than in other apertures positioned downstream thereof (e.g., aperture 2). The etching rate does not so vary in all of the apertures positioned downstream of the first aperture. The dummy aperture 3 that is the first aperture has been formed for different purpose from the second apertures (e.g., aperture 2) positioned downstream thereof and therefore subjected to different process from the second apertures after formation of these apertures. In particular, for example, an aperture positioned downstream of the first aperture, namely, the second aperture is used as a liquid supply port formed in the silicon substrate of a liquid ejection head, and the first aperture is not used as a liquid supply port formed in the silicon substrate of a liquid ejection head. The etching rate does not so vary in the apertures positioned downstream of the first aperture as illustrated in FIG. 5, and these apertures have a relatively uniform shape. In this process, the first aperture is not used as a liquid supply port formed in the silicon substrate of a liquid ejection head, so that liquid ejection heads to be produced can have apertures having a properly uniform shape. Although each line in which the apertures are arranged may have any number of the dummy apertures, forming two or more dummy apertures is less likely to produce a significant effect. Thus, one dummy aperture is sufficiently formed in each line in which the apertures are arranged.

The first aperture may be formed so as not to penetrate through a silicon wafer. The first aperture formed so as not to penetrate through a silicon wafer can enhance the strength of the silicon wafer. In contrast, the second aperture eventually penetrates through the silicon wafer. Hence, time taken for penetrating through a silicon wafer may be adjusted by, for instance, preliminary treatment in which portion to be formed into the second aperture is irradiated with a laser to form a hole and in which portion to be formed into the first aperture is not irradiated with a laser, in other words, a hole is not formed.

The first aperture can have a variety of shapes as illustrated in FIGS. 8A to 8E. The second aperture may be formed so as to have a shape proper for final products. In this case, each of the first aperture and the second aperture may have a rectangular shape in view of, for example, stability of etching. All of the apertures which are arranged in a line may have a rectangular shape. Individual apertures may be formed such that the longitudinal directions of their rectangular shapes are substantially parallel to each other. In particular, the configuration in which the longitudinal direction of the first aperture is substantially parallel to the longitudinal direction of the second aperture enables the first aperture to effectively serve as the dummy aperture. Furthermore, the first aperture and the second aperture may have substantially the same width in a direction perpendicular to a flow direction of an etchant. This configuration also enables the first aperture to effectively serve as the dummy aperture. Moreover, all of the apertures which are arranged in a line may have substantially the same width in a direction perpendicular to a flow direction of an etchant. The term "substantially" used, for instance, in the form of "substantially the same" herein means that minor differences brought about by manufacturing errors or other factors is included.

EXAMPLES

Examples of the present invention will now be described.

Example 1

Figure 6A:
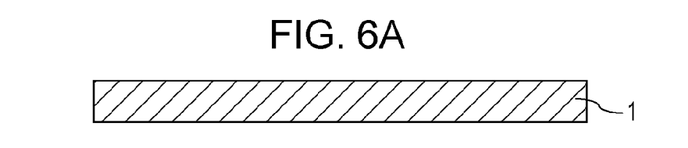
FIGS. 6A to 6G are cross-sectional views illustrating a silicon wafer in an etching process.
Figure 6B:
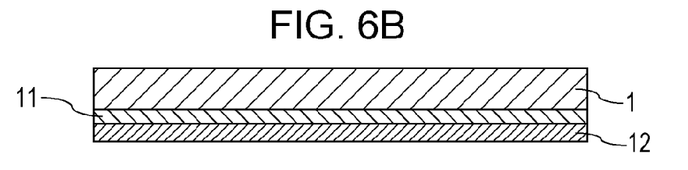
Figure 6C:
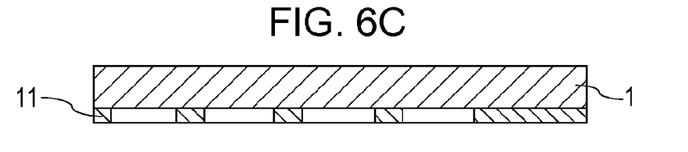

A silicon wafer 1 having a surface with a crystal orientation of (100) was prepared (FIG. 6A). Then, HIMAL-1200CH (trade name, manufactured by Hitachi Chemical Company, Ltd.) was applied onto the surface of the silicon wafer 1 by spin coating to form a protective layer 11, and THMR-iP5700 (trade name, manufactured by TOKYO OHKA KOGYO CO., LTD.) that was a positive resist was applied onto the protective layer 11 also by spin coating (FIG. 6B) to form a resist layer 12. The resist layer 12 formed in this manner was irradiated with ultraviolet light with an exposure apparatus and then developed to form openings in the resist layer 12, thereby forming the resist layer 12 into a mask for the protective layer 11. The protective layer 11 was dry-etched through this mask to form openings in the protective layer 11. Then, the resist layer 12 was removed (FIG. 6C). The openings formed in the protective layer 11 included openings corresponding to apertures which would be used as liquid supply ports formed in the silicon substrates of liquid ejection heads and an opening corresponding to a dummy aperture which would be positioned upstream of the other apertures.

Figure 6D:
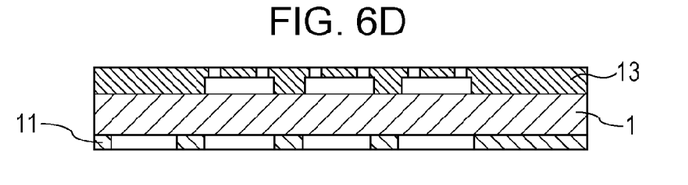

Then, a channel-forming member 13 used for forming liquid ejection ports and liquid channels was formed on a surface of the silicon wafer 1, this surface being opposite to the protective layer 11-formed surface (FIG. 6D).

The silicon wafer 1 having the protective layer 11 and the channel-forming member 13 was disposed in an etching apparatus illustrated in FIG. 1. The silicon wafer 1 was disposed between a chamber 4 and a support member 5, and pressure was applied with an air cylinder 6, thereby sealing the chamber 4 with the aid of an O-ring resistant to an etchant (not illustrated) such that the leakage of a liquid was eliminated.

Figure 6E:
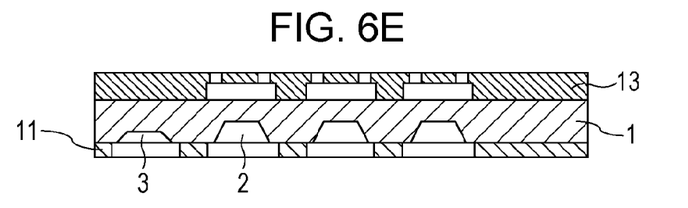
Figure 6F:
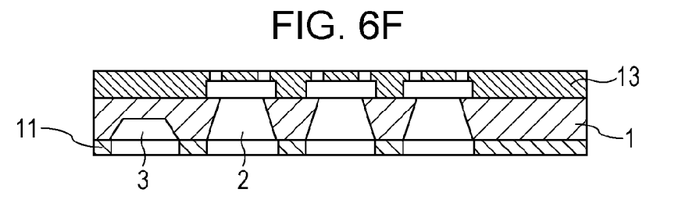
Figure 6G:
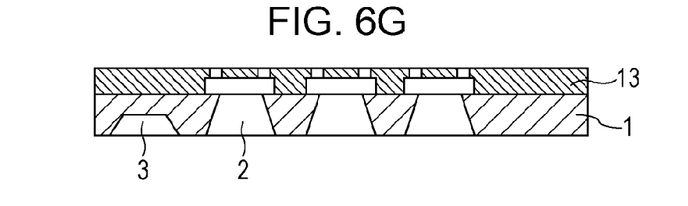
Figure 7A:
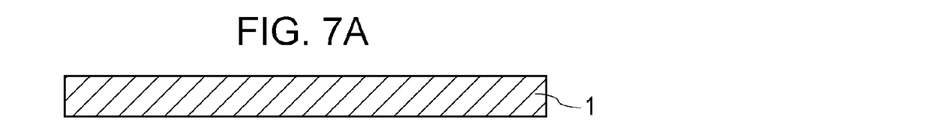
FIGS. 7A to 7G are cross-sectional views illustrating a silicon wafer in an etching process.
Figure 7B:
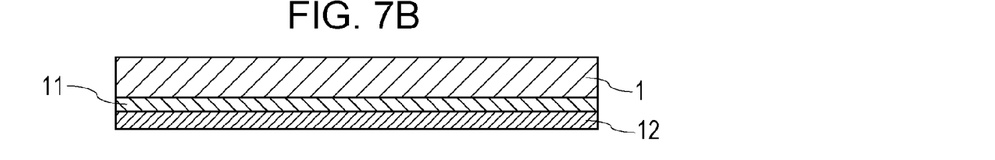
Figure 7C:
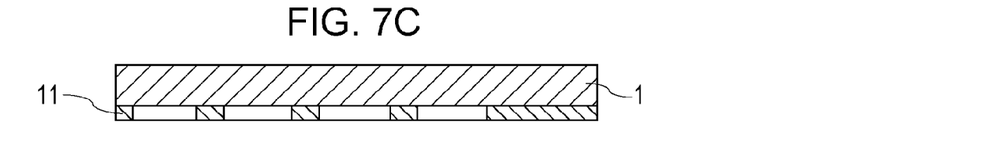
Figure 7D:
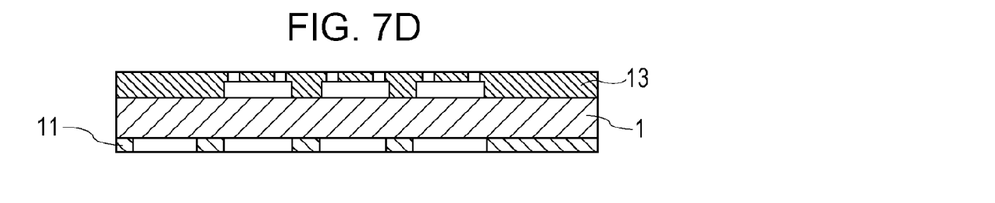
Figure 7E:
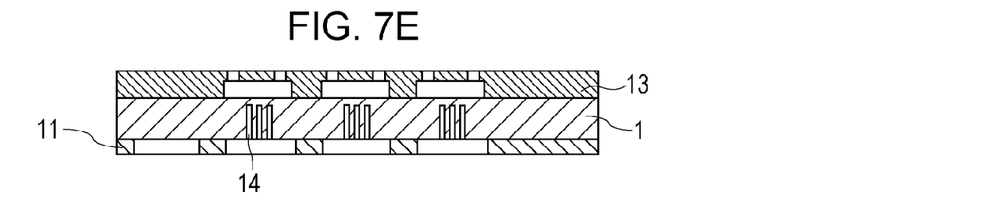
Figure 7F:
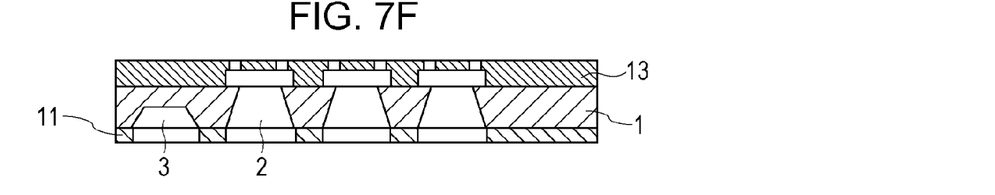
Figure 7G:
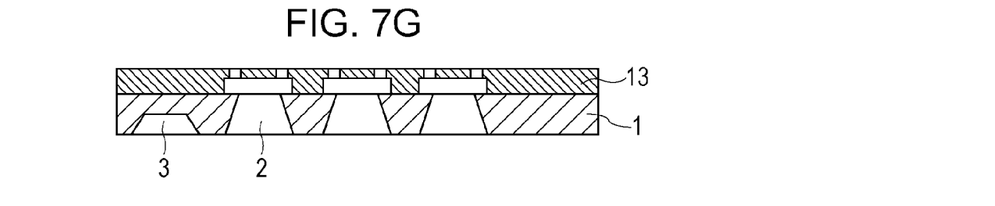
Figure 8A:
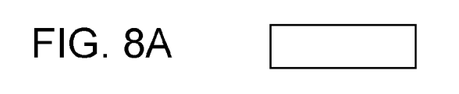
FIGS. 8A to 8E illustrate shapes of a first aperture.
Figure 8B:
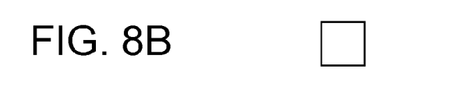
Figure 8C:
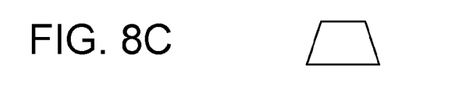
Figure 8D:
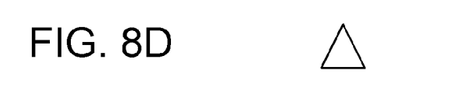
Figure 8E:
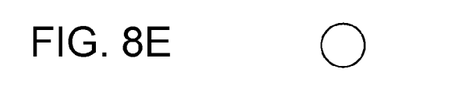

Then, an etchant 7 was allowed to flow along the surface of the silicon wafer 1 to form a line in which multiple apertures were arranged in a flow direction of the etchant 7 from the upstream side to the downstream side. The etchant 7 used was an aqueous solution containing 22 mass% of TMAH. The etchant 7 was allowed to flow on the surface of the silicon wafer 1 substantially in one direction. The etchant 7 discharged from the chamber 4 flowed into an overflow bath (not illustrated). A heater (not illustrated) was placed in the overflow bath, and the temperature was held at 83° C. to warm the etchant 7. The etchant 7 was continuously supplied into the chamber 4 with a circulating pump (not illustrated). Multiple apertures were formed in the silicon wafer 1 through such an etching process (FIGS. 6E and 6F). Among the multiple apertures, a first aperture formed on the most upstream side in the flow direction of the etchant 7 was an aperture 3. A second aperture that was an aperture formed downstream thereof was, for instance, an aperture 2. The protective layer 11 was subsequently removed to yield a silicon wafer having apertures (FIG. 6G).

Then, the produced silicon wafer was cut with a dicing blade by each aperture, thereby yielding multiple silicon substrates having apertures. Each silicon substrate having the second aperture was suitably used for forming a liquid ejection head including a silicon substrate in which a liquid supply port had been formed. In contrast, a silicon substrate having the first aperture was analyzed with a microscope to determine whether this silicon substrate was suitable for being used for forming a liquid ejection head including a silicon substrate in which a liquid supply port had been formed or not. The analysis showed that the shape of the aperture was greatly different from the shape of the second aperture; thus, this silicon substrate was not used for forming a liquid ejection head including a silicon substrate in which a liquid supply port had been formed.

The liquid supply ports of liquid ejection heads including the silicon substrates produced in Example 1 were observed with a microscope, and results of the observation showed that a difference in the shape of the liquid supply port between the liquid ejection heads was ±1%, which indicates that each liquid supply port had a highly uniform shape.

Example 2

Apertures were formed in a silicon wafer 1 through processes illustrated in FIGS. 7A to 7G. The processes up to and including FIG. 7D were the same as those up to and including FIG. 6D in Example 1. Then, although part of the silicon wafer 1 to be formed into a dummy aperture that was the first aperture was not irradiated with a laser, the silicon wafer 1 other than this part was irradiated with a laser to form non-through holes 14. The other processes were carried out as in Example 1.

The liquid supply ports of liquid ejection heads including the silicon substrates produced in Example 2 were observed with a microscope, and results of the observation showed that a difference in the shape of the liquid supply port between the liquid ejection heads was ±1%, which indicates that each liquid supply port had a highly uniform shape.

Comparative Example

Comparative Example was different from Example 1 in that a dummy aperture was not formed in a silicon wafer 1. In addition, each of the formed apertures was processed in the same manner after formation thereof and used as a liquid supply port formed in the silicon substrate of a liquid ejection head. Except these changes, the other processes were carried out as in Example 1.

The liquid supply ports of liquid ejection heads including the silicon substrates produced in Comparative Example were observed with a microscope, and results of the observation showed that a difference in the shape of the liquid supply port between the liquid ejection heads was up to 3%, which indicates that each liquid supply port had a low uniformity in shape.

Even in the case where an etchant is allowed to flow along the surface of a silicon wafer to form multiple apertures in a silicon wafer and where the apertures are used to produce products, the present invention enables such products to have apertures having a more uniform shape.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-144318 filed Jun. 27, 2012, which is hereby incorporated by reference herein in its entirety.

What is claimed is:

1. A method for processing a silicon wafer, the method comprising:
    allowing an etchant, which is a liquid, to flow along a surface of the silicon wafer to form a line in which a plurality of apertures are arranged in a flow direction of the etchant from an upstream side to a downstream side,
    wherein the apertures arranged in the line include a first aperture formed on the most upstream side and a second aperture formed downstream of the first aperture in the flow direction of the etchant,
    wherein the first aperture and the second aperture are subjected to different processes after being formed, and
    wherein, among the apertures arranged in the line, each aperture formed downstream of the first aperture in the flow direction of the etchant is subjected to the same process after being formed.

2. The method according to claim 1, wherein
    the apertures are arranged in a plurality of lines, and
    in each of the lines in which the apertures are arranged, the apertures include the first aperture formed on the most upstream side and the second aperture formed downstream of the first aperture in the flow direction of the etchant.

3. The method according to claim 1, wherein, in the different processes to which the first aperture and the second aperture are subjected after being formed, the first aperture is not used as a liquid supply port formed in a silicon substrate of a liquid ejection head, and the second aperture is used as a liquid supply port formed in a silicon substrate of a liquid ejection head.

4. The method according to claim 1, further comprising, in the different processes to which the first aperture and the second aperture are subjected after being formed, determining whether or not the first aperture is used as a liquid supply port formed in a silicon substrate of a liquid ejection head, and not determining whether or not the second aperture is used as a liquid supply port formed in a silicon substrate of a liquid ejection head.

5. The method according to claim 1, wherein the first aperture does not penetrate through a silicon wafer.

6. The method according to claim 1, wherein each of the first aperture and the second aperture has a rectangular shape, and the longitudinal directions of the rectangular shapes of the first and second apertures are substantially parallel to each other.

7. The method according to claim 1, wherein each of the apertures arranged in the line has a rectangular shape, and the longitudinal directions of the rectangular shapes of the apertures are substantially parallel to each other.

8. The method according to claim 1, wherein the first aperture and the second aperture have substantially the same width in a direction perpendicular to a flow direction of the etchant.

9. The method according to claim 1, wherein each of the apertures arranged in the line has substantially the same width in a direction perpendicular to the flow direction of the etchant.

10. A method for processing a silicon wafer, the method comprising:
    allowing an etchant, which is a liquid, to flow along a surface of the silicon wafer to form a line in which a plurality of apertures are arranged in a flow direction of the etchant from an upstream side to a downstream side,
    wherein the apertures arranged in the line include a first aperture formed on the most upstream side and a second aperture formed downstream of the first aperture in the flow direction of the etchant,
    wherein the first aperture and the second aperture are subjected to different processes after being formed, and
    wherein, among the apertures arranged in the line, each aperture formed downstream of the first aperture is to be used as a liquid supply port formed in a silicon substrate of a liquid ejection head, and the first aperture is not to be used as a liquid supply port formed in a silicon substrate of a liquid ejection head but to be used as a dummy aperture of the liquid supply port.

11. The method according to claim 10, wherein
    the apertures are arranged in a plurality of lines, and
    in each of the lines in which the apertures are arranged, the apertures include the first aperture formed on the most upstream side and the second aperture formed downstream of the first aperture in the flow direction of the etchant.

12. The method according to claim 10, wherein, in the different processes to which the first aperture and the second aperture are subjected after being formed, the first aperture is not used as a liquid supply port formed in a silicon substrate of a liquid ejection head, and the second aperture is used as a liquid supply port formed in a silicon substrate of a liquid ejection head.

13. The method according to claim 10, further comprising, in the different processes to which the first aperture and the second aperture are subjected after being formed, determining whether or not the first aperture is used as a liquid supply port formed in a silicon substrate of a liquid ejection head, and not determining whether or not the second aperture is used as a liquid supply port formed in a silicon substrate of a liquid ejection head.

14. The method according to claim 10, wherein the first aperture does not penetrate through a silicon wafer.

15. The method according to claim 10, wherein each of the first aperture and the second aperture has a rectangular shape, and the longitudinal directions of the rectangular shapes of the first and second apertures are substantially parallel to each other.

16. The method according to claim 10, wherein each of the apertures arranged in the line has a rectangular shape, and the longitudinal directions of the rectangular shapes of the apertures are substantially parallel to each other.

17. The method according to claim 10, wherein the first aperture and the second aperture have substantially the same width in a direction perpendicular to a flow direction of the etchant.

18. The method according to claim 10, wherein each of the apertures arranged in the line has substantially the same width in a direction perpendicular to the flow direction of the etchant.

* * * * *